METHOD FOR MAKING MIS STRUCTURES

Filed March 27, 1967 2 Sheets-Sheet 1

INVENTORS: R. E. KERWIN
D. L. KLEIN
J. C. SARACE
BY [signature]
ATTORNEY

United States Patent Office 3,475,234

Patented Oct. 28, 1969

3,475,234

METHOD FOR MAKING MIS STRUCTURES

Robert E. Kerwin and Donald L. Klein, Union, and John C. Sarace, Somerset, N.J., assignors to Bell Telephone Laboratories, Incorporated, Murray Hill and Berkeley Heights, N.J., a corporation of New York Filed Mar. 27, 1967, Ser. No. 626,056

Int. Cl. H01l *7/50, 11/14*

U.S. Cl. 148—187 9 Claims

ABSTRACT OF THE DISCLOSURE

The invention is concerned with methods for making MIS structures and particularly, field-effect transistors. The problem of making large arrays of miniature MIS devices without critical alignment of masks between sequential etch and diffusion steps is treated. The process also makes use of multiple dielectric layers and a self-limiting etch technique based on the use of a differential etchant. The proper location of the gate electrode with respect to the source and drain junctions is insured by using a silicon gate electrode as the diffusion mask for defining the source and drain junctions.

Figure 1:
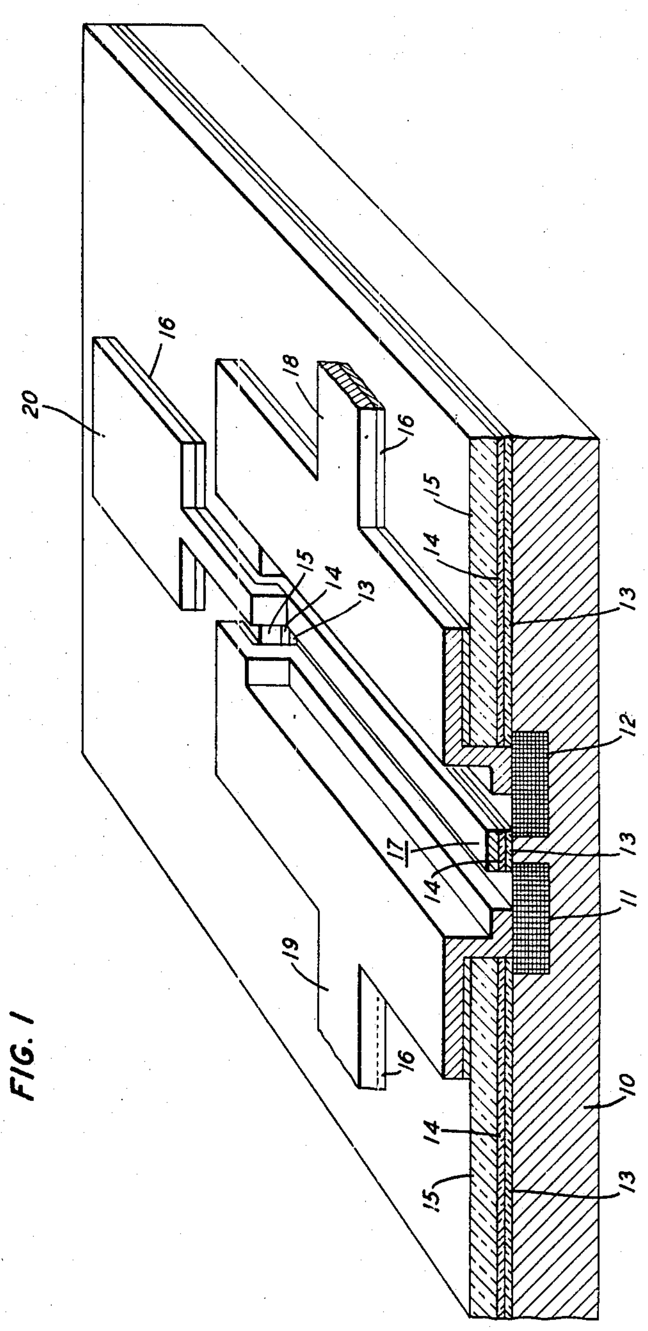

This invention is a method for fabricating structures useful in semiconductor devices of the MIS type.

Semiconductor devices which include a metal, insulator, semiconductor composite structure have become extremely important in the semiconductor industry. Such devices are currently being proposed for integrated and logic circuits in which large arrays of very small devices, are made on a single substrate body. The reliability or yield factor of the manufacturing operation in such cases is a crucial problem. For instance, a typical memory array might require several thousand active devices per square inch with a 100 percent yield. Obviously, there is a vital need for highly reliable and economic methods for manufacturing such arrays. This invention is directed to one such method.

The devices of greatest interest which incorporate the MIS structure are largely field-effect transistors. However, for certain other devices this structure is convenient although the functions of the three layers may be quite different from those in the operation of the field-effect devices. As an example in this category is a structure which is used in an electro-optic device to perform the general function of a vidicon target. The structure contains large arrays of photosensitive diodes. These diodes, which contain diffused junctions, are passivated or protected with an insulating film. It has been found that a metal layer deposited on the insulating layer is beneficial in dissipating accumulated charges on the insulator surface. The structure which is common to these devices, and to other devices including many perhaps not yet conceived, is a semiconductor body containing a diffused impurity layer, an insulating layer on selected portions of the semiconductor body and a metal or conductive layer covering at least a portion of the insulating layer. While these devices are customarily referred to as MOS (metal-oxide-semiconductor), MNS (metal-nitride-semiconductor) or generically, MIS (metal-insulator-semiconductor) devices, it is obvious that the metal layer functions in each case as a conductor. For reasons which will become apparent the characterization of this conductive layer as a metal in connection with this invention is inaccurate. It will hereinafter be referred to as the conductive layer although the shorthand "MIS" is used for convenience.

The simplest of the prior art techniques for making structures such as those described above would involve the growth of the oxide layer, etching the oxide layer to form the desired pattern, diffusion to form localized diffused layers and finally etching of an evaporated metal film to form the electrodes or conductive surface layer. The diffusion step and the metal etching step both require masks to define the desired pattern. Techniques for forming diffusion and metallization masks on semiconductors are highly developed and have been very effective for making semiconductor devices used in the past. However, for the integrated microcircuits and arrays of diodes and transistors in current demand, the prior art methods have been found to be deficient in terms of yield. This is largely due to the fact that where the fabrication technique requires more than one critical masking operation it is difficult to obtain proper registration between the first pattern and a subsequent pattern with a tolerable yield. According to this invention, MIS structures can be made without a critically aligned masking operation so that the necessary yield can be realized. One aspect of the novel method involves the deposition of silicon on the insulating layer and the use of the deposited silicon as a mask to define the diffusion mask pattern in the intermediate insulating layer. The silicon layer is converted to a conductive layer by the diffusion process. By this method a reliable registration is obtained between all three layers. The difficult step of subsequently applying electrodes or a conductive film to critical regions of an intricate pattern is eliminated.

Figure 2:
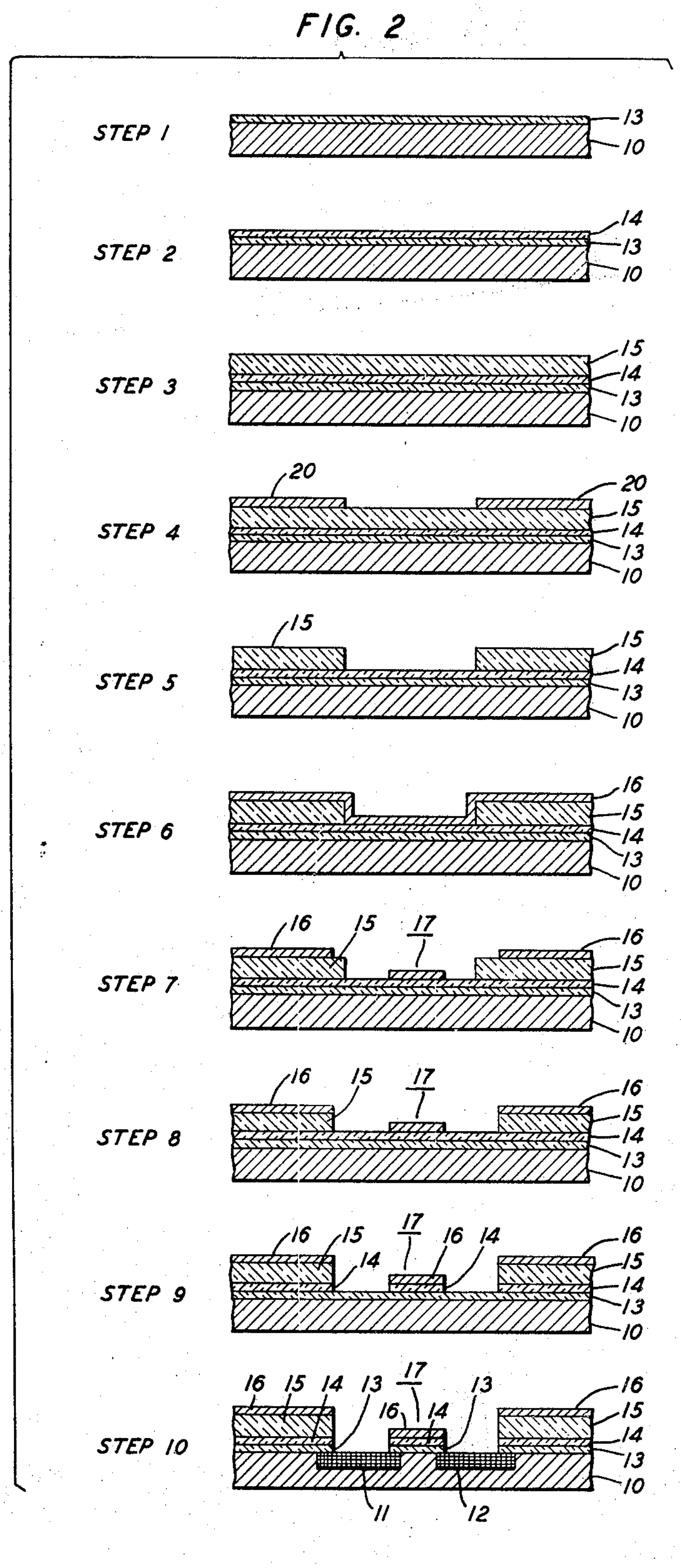

These and other aspects of the invention will become apparent from a consideration of the following detailed description. In the drawing:

FIG. 1 is a perspective view partly in section showing an MIS structure which may be fabricated in accordance with this invention; and FIG. 2 is a schematic sequential representation of the steps used to form an MIS structure according to a preferred embodiment of this invention.

A field-effect transistor incorporating an MIS structure is shown in FIG. 1. This detailed description will be directed to the fabrication of this particular device but it should be understood that this description is given as exemplary of the fabrication of a class of devices having an MIS structure.

In FIG. 1 the substrate 10 is p-type silicon containing n-type diffused regions 11 and 12. The insulating film 13 is silicon dioxide having a thickness of the order of 600 A. Overlying the oxide film is a layer of silicon nitride 14 approximately 400 A. thick. A thicker (10,000 A.) layer of silicon dioxide 15 covers the nitride film. The layer 16 is polycrystalline silicon which also covers the gate electrode shown at 17. The thick metal electrodes 18, 19 and 20 serve as contacts. The source electrode is shown at 18, the drain electrode at 19 and the gate electrode contact at 20.

In the structure shown in FIG. 1 the principal fabricating problem is the formation of the gate electrode 17. The insulating layer of the gate electrode indicated at 14 must overlap the source and drain junctions formed by the diffused regions 11 and 12. The electrically conductive layer 17 must be coextensive with the insulating layer without overlapping and shorting to the diffused region. In the usual prior art process the conductive layer 17 is evaporated onto the insulating layer 14 after the diffusion step. The metal layer cannot be applied before the diffusion step due to the obvious degradation problems associated with the presence of metal during the high-temperature diffusion operation. However, the application of the conductive film as a step distinct from the diffusion step requires intermediate oxidation, masking and etching steps to satisfy tolerance requirements plus a separate masking operation to define the regions from which the deposited metal is to be etched away. These additional masking and etching operations result in undesirably high junction and gate capacitances, with concomitant frequency response limitations. With devices of this size and character, obtaining the proper registration of these masks over the entire array so as to avoid the overlap problem mentioned above will in many cases be beyond the capability of prior art techniques.

According to one embodiment of this invention a layer of polycrystalline silicon is deposited on the insulating layer and the diffusion pattern is formed by etching through both layers. The diffused regions are formed in the usual way. During diffusion the silicon layer is doped with impurities also so that it becomes sufficiently conductive to function as a conductive film on the gate structure. The formation of the diffused regions with the ultimate conductive layer already in place and serving as the diffusion mask assures proper orientation between the three layers and is the essential feature of the process.

A specific sequence of steps for forming the FET structure of FIG. 1 is shown in FIG. 2.

The substrate 10 is a single crystal silicon (111) oriented, cut and lapped, and polished with a mixture of hydrofluoric, nitric and acetic acids saturated with iodine. The thin silicon dioxide film 13 is steam grown at 1,050° C. The film thickness may vary from one hundred to several thousand angstroms. However, in the structure shown a thickness of 200 A. to 1,000 A. is most suitable. The film 13 may be deposited by other methods such as the decomposition of tetraethoxysilane or by a plasma process such as that described in U.S. Patent 3,287,243, issued Nov. 22, 1966 to J. R. Ligenza, or application Ser. No. 576,654, filed Sept. 1, 1966 by A. Androshuk and W. C. Erdman. However, films grown by steam oxidation are generally acknowledged to be particularly suitable for devices of this kind. It is significant to note that the typical prior art technique for making FET devices requires that the silicon dioxide film that serves as the diffusion mask must be removed after diffusion and a new film produced to serve as gate insulator. This is done because of the degradation of the insulating properties of the original oxide film during exposure to the diffusion ambient. This requirement for producing a new gate insulating film late in the process sequence mitigates against obtaining a film of sufficiently high purity to behave in a well-controlled manner. In the present invention the gate insulator film is produced at the beginning of the processing sequence on a substrate surface which is as clean as the present state of the art permits (see United States Patent 3,224,904) and is protected during the diffusion by the deposited silicon film.

In Step 2 a layer 14 of silicon nitride is deposited on the oxide layer 13. This layer is deposited by pyrolytic decomposition of silane and ammonia at approximately 1,000° C. Alternatively it may be deposited by one of the plasma techniques referred to above. A thorough treatment of a suitable pyrolytic technique is described in U.S. application, Ser. No. 577,208, filed Sept. 6, 1966 by M. J. Grieco, B. Schwartz and F. L. Worthing. The thickness of the layer 14 is comparable to that of layer 13. The two insulating layers 13 and 14 ultimately form the intermediate layer of the MIS device. The total thickness of these films is preferably within the range of 400 A. to 4,000 A. Several effective devices have been made with layer 13, 600 A. thick and layer 14, 400 A. thick. The use of a combined silicon dioxide-silicon nitride layer has been found to improve the electrical characteristics of the gate by lowering the threshold voltage and improving its stability. However, a single homogeneous layer of silicon nitride would also be effective. Other insulating materials such as aluminum oxide, aluminum nitride, beryllium oxide and composite layers including these materials as well as other dielectrics would also be useful in the gate structure.

The thicker dielectric layer 15 provides an electrically isolated surface on which to deposit conductive paths to minimize parasitic capacitance. In this specific example this layer is silicon dioxide approximately 10,000 A. thick and produced by the decomposition of tetraethoxysilane at 550° C. At this temperature approximately seven and one-half hours are required to deposit the film. Again the technique used for depositing the layer is not critical. The methods discussed in connection with the formation of layer 13 can be used also. Since this coating ultimately serves only a separator function its thickness is not critical. At least 2,000 A. would be a reasonable minimum and no useful purpose would appear to be served by extending the deposit beyond 4 or 5 microns.

The composition of the layers 14 and 15 are chosen not only for their dielectric properties but also for their chemical etching properties. Thus, for instance, in the present case where the layer 14 is silicon nitride and the layer 15 is silicon dioxide the silicon dioxide may be removed with an etch that does not appreciably attack the silicon nitride in layer 14. The layer 14 thus serves as a self-limiting etch barrier.

In Step 4 of FIG. 2 the silicon dioxide layer 15 is masked in the conventional manner with a photoresist 20.

The photoresist procedure used in this particular embodiment involved KTFR in a 1:1 xylene solution applied to the surface of the wafer with a syringe. The wafer was spun at 15,000 r.p.m. to result in a uniform coating 0.65$\mu$ thick. The resist-coated wafer was dried for 20 minutes at 80° C. in one-half atmosphere of nitrogen. While being held in intimate contact with the appropriate high resolution mask the resist is exposed to a collimated beam of ultraviolet light. After exposure the negative image is developed by immersion in Stoddard Solvent, then rinsed and hardened in acetone. The wafer is then post-baked at 120° C. for 20 minutes in a nitrogen ambient and is then ready for etching In Step 5 the silicon dioxide is etched away with ammonium bifluoride. Since the silicon nitride in layer 14 resists attack by this particular etchant the etching essentially terminates after removal of the oxide layer leaving the nitride layer 14 largely intact. The relative etch rates using this particular etchant are greater than 10:1. For the purposes of this invention an etch is considered preferential if it etches one layer more than five times faster than the other layer. As indicated above this self-limiting etch step is a valuable feature of this processing technique. Other combinations of insulating films can also provide this beneficial effect. After the self-limiting etch step the photoresist 20 is removed.

In Step 6 a layer of silicon 16 is deposited over the entire surface. This layer may be deposited by a conventional evaporation process, by pyrolytic decomposition of $SiCl_4$ and $H_2$, by cathodic sputtering or by any other known method. A specific procedure for depositing a silicon layer is described in U.S. Patent 3,172,792, issued to E. T. Handelman on Mar. 9, 1965.

Step 7 involves a second photoresist and etching operation (which may be conducted in the same manner as previously) to etch the silicon layer and form a mask defining the source, drain and gate areas. The silicon left exposed after the photoresist is applied is etched away with a mixture of hydrofluoric, nitric and acetic acids saturated with iodine. The geometry becomes evident in Step 7 where the gate structure 17 is beginning to be formed. An important feature of this processing technique is illustrated in Step 7 and resides in the fact that the photoresist mask for etching the gate electrode need not be critically placed. The only essential requirement in the registration of the photoresist mask is that the gate area be contained somewhere in the channel formed in the $SiO_2$ layer 15 in Step 5. In Step 7 of FIG. 2 the photoresist is intentionally shown misaligned to illustrate the noncriticality of the registration. In Step 8 the $SiO_2$ exposed after the etch of Step 7 is removed with ammonium bifluoride and the gate electrode 17 is automatically restored to the central position in the channel. It will be recognized that this result is also a consequence of the fact that the mask apiled in Step 7 provides for a wider channel in the $SiO_2$ layer 15 than was made in Step 5.

At this point in the process the silicon layer 16 is etched to define the source, drain and gate electrode pads and the interconnections (not shown) between the devices.

In Step 9, the exposed silicon nitride in layer 14 is removed with hot phosphoric acid which does not significantly attack any of the other layers. The underlying $SiO_2$ in layer 13 is removed with ammonium bifluoride exposing the silicon substrate on each side of the gate 17. Step 10 is the diffusion step in which the source region 12 and drain region 11 are formed by a standard diffusion step. Since the diffusion step is performed after the gate is located the proper positioning of the source and drain junctions with respect to the gate to give a definite but minimum overlap is guaranteed. At the same time the silicon layer 16 becomes sufficiently doped with impurities to become conductive. For the purposes of this invention this layer should be doped to have a resistance of about 10 ohms per square or less. The diffusion operation itself is standard such as that described in U.S. Patent 3,066,052, issued to B. T. Howard on Nov. 27, 1962. FIG. 1 shows a p-type silicon substrate with n-type source and drain channels, however structures with the reverse conductivity type relationship can be made using an n-type substrate and a p-type impurity such as boron in place of the n-type impurity which is usually phosphorus.

A standard photoresist and etch operation is performed followed by a metallization, photoresist and etch to form the electrode pads 18, 19 and 20 (FIG. 1). The silicon layer is itself conductive but a thicker metal coating such as gold or aluminium improves the interconnections. The presence of a dual conduction path contributes to a higher yield in the event of a discontinuity in one of the layers. It has been found that by annealing the devices in hydrogen for approximately one hour or more at a temperature of at least 300° C. the electrical performance of the device can be improved. The anneal should take place before metallization.

Both n channel and p channel enhancement mode MIOS transistors were fabricated by this process. The individual devices were characterized by measuring their fundamental parameters, i.e., surface charge density under the gate, threshold voltage, tranconductance and effective mobility.

A simple realtively large rectangular geometry was used for both n and p channel transistors. The gate dimensions were 0.001 by 0.008 inch with source and drain dimensions of 0.004 by 0.008 inch. The n channel devices were made from 1.3 ohms cm. p-type silicon (111) oriented. The p channel devices were made from 0.8 ohms cm. (111) oriented n-type silicon. The gate insulators were 600 A. of silicon dioxide and 400 A. of silicon nitride. The diffusions produced source and drain junction depths of 2 microns with surface concentrations greater than $10^{19}$ atoms/cc. for n and p type diffusions. The evaporated silicon film was 5,000 A. thick. After diffusion its sheet resistivity was approximately 10 ohms per square.

The average values of some electrical characteristics of these devices are tabulated below:

TABLE I

| Channel Type | Threshold Voltage ($V_T$) | Mobility ($\mu$) | Transconductance at $V_D$=10V $V_G$=4V ($G_m$) |
|---|---|---|---|
| p channel | −1.95 | 173 | 130 |
| n channel | +0.95 | 380 | 360 |

where:

$V_T$=Threaded Voltage
$\mu$=Mobility (cm.²/volt-sec.)
$G_m$=Transconductance (microohm)

$V_D$=Drain Voltage
$V_G$=Gate Voltage

The table shows that the device characteristics are competitive with those made by standard processing.

The device shown in FIG. 1 is but one example of a device utilizing an MIS structure having a diffused region in the semiconductor substrate. Many devices using this basic structure can be made using the technique of this invention, that is, depositing a silicon layer on the insulating layer to function as a diffusion mask, and diffusing impurities both into the semiconductor substrate to form the diffused region and into the silicon mask to form a conductive layer.

Various additional modifications and extensions of this invention will become apparent to those skilled in the art. All such variations and deviations which basically rely on the teachings through which this invention has advanced the art are properly considered within the spirit and scope of this invention.

What is claimed is:

1. A method for making a semiconductor structure having a diffused region of one conductivity type in a semiconductor substrate of the opposite conductivity type which comprises forming an insulating layer on said semiconductor substrate, forming a silicon layer over selected portions of said insulating layer, etching away the exposed portions of said insulating layer using said silicon layer as a mask, diffusing impurities into the exposed portions of said semiconductor substrate to form said semiconductor substrate to form said diffused region and simultaneously or separately diffusing impurities into the silicon layer to render it conductive.

2. A method for making a field-effect transistor which includes at least two diffused separated regions of one conductivity type formed in a semiconductor substrate having the opposite conductivity type to provide a source junction and a drain junction, and a gate electrode comprising an insulating layer and an overlying conductive layer; said gate electrode having a critical spatial relationship with respect to the diffused region so that it slightly overlaps both of the separated diffused regions, which comprises the steps of:

- forming a first insulating layer on said semiconductor substrate,
- depositing a second insulating layer over said first insulating layer, the second layer having a composition different from that of the first layer,
- etching away selected portions of said second layer with an etchant which does not appreciably attack said first layer to form a channel in said second layer,
- forming a layer of silicon over the entire etched surface,
- etching away at least the portion of said silicon layer covering the said channel except for a strip of silicon within, and spaced from, the portions of the second layer forming the said channel, said strip extending over a substantial portion of the length of the channel,
- etching away the exposed portions of the said first layer, and
- diffusing impurities into the exposed portions of said semiconductor substrate to form said diffused regions.

3. The method of claim 2 further comprising, prior to said step of etching away said portion of said silicon layer, the step of forming on said silicon layer an etch mask which has an open portion wider than said channel and a mask portion within said opening portion for making said strip of silicon.

4. The method of claim 2 in which said semiconductor substrate is silicon the said first layer is silicon nitride and the said second layer is silicon oxide.

5. The method of claim 4 further including the additional step of forming a layer of silicon dioxide on said silicon substrate and depositing the said first layer of silicon nitride on the layer of silicon dioxide to improve the electrical performance of the transistor.

6. The method of claim 2 wherein ammonium bifluoride is used to etch away the said second layer without appreciably attacking the said first layer.

7. The method of claim 2 applied simultaneously to the fabrication of more than one transistor and in which the silicon layer is selectively etched to form connections between the gate, drain and source of two or more devices.

8. The method of claim 7 further including metallization of the said silicon connections and metallization of a region along the edge of the channel to connect the silicon layer with the source and drain diffused regions.

9. The method of claim 1 wherein the silicon layer is formed by depositing a continuous silicon layer over the insulating layer and etching away selected portions of the silicon layer.

References Cited

UNITED STATES PATENTS

| | | | |
|---|---|---|---|
| 3,355,637 | 11/1967 | Johnson | 317—235 |
| 3,402,081 | 9/1968 | Lehman | 148—188 |
| 3,427,514 | 2/1969 | Olmstead et al. | 317—235 |

DEWAYNE RUTLEDGE, Primary Examiner

R. A. LESTER, Assistant Examiner

U.S. Cl. X.R.

29—571; 148—189; 317—235